(12) United States Patent
An

(10) Patent No.: US 11,193,954 B2
(45) Date of Patent: Dec. 7, 2021

(54) PROBE CARD AND TEST APPARATUS HAVING THE PROBE CARD

(71) Applicant: SK hynix Inc., Icheon-si (KR)

(72) Inventor: Kyu Joong An, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/898,112

(22) Filed: Jun. 10, 2020

(65) Prior Publication Data
US 2021/0208183 A1 Jul. 8, 2021

(30) Foreign Application Priority Data
Jan. 3, 2020 (KR) .................. 10-2020-0000792

(51) Int. Cl.
*G01R 31/26* (2020.01)
*G01R 1/073* (2006.01)
*G01R 31/14* (2006.01)
*H01L 21/67* (2006.01)
*G01R 31/28* (2006.01)

(52) U.S. Cl.
CPC ......... *G01R 1/07307* (2013.01); *G01R 31/14* (2013.01); *G01R 31/26* (2013.01); *G01R 31/2887* (2013.01); *H01L 21/67242* (2013.01)

(58) Field of Classification Search
CPC ............. G01R 1/0483; G01R 1/06794; G01R 31/2601; G01R 31/2893
See application file for complete search history.

(56) References Cited

U.S. PATENT DOCUMENTS

| 2009/0002001 A1* | 1/2009 | Caldwell ............ G01R 1/07342 324/754.07 |
| 2017/0131348 A1* | 5/2017 | Dau .................... G01R 1/0491 |
| 2017/0285071 A1* | 10/2017 | Lee ......................... G01R 3/00 |

FOREIGN PATENT DOCUMENTS

| KR | 1020110136702 A | 12/2011 |
| KR | 1020150095377 A | 8/2015 |

* cited by examiner

*Primary Examiner* — Tung X Nguyen
(74) *Attorney, Agent, or Firm* — William Park & Associates Ltd.

(57) ABSTRACT

A test apparatus includes a probe card and a tester. The probe card has a plurality of regions corresponding to dies of a wafer, respectively. The probe card includes a tray having a first region with a lens and a second region without a lens. The tester is configured to generate a drive control signal for moving the tray in a first direction or a second direction to locate the first region or the second region at a position facing the dies.

20 Claims, 8 Drawing Sheets

PROBE CARD AND TEST APPARATUS HAVING THE PROBE CARD

CROSS-REFERENCES TO RELATED APPLICATION

The present application claims priority under 35 U.S.C. § 119(a) to Korean application number 10-2020-0000792, filed on Jan. 3, 2020, in the Korean Intellectual Property Office, which is incorporated herein by reference in its entirety.

BACKGROUND

1. Technical Field

Various embodiments may generally relate to a semiconductor device, and more particularly, to a probe card and a test apparatus having the probe card.

2. Related Art

A CMOS image sensor (CIS) may be configured to read information of an object using a low consumption type charge-coupled device (CCD) to convert the information into electrical image signals. The CIS may function as to a camera film configured to convert light energy into electrical energy to form an image.

The CIS may be configured to form MOS transistors by numbers of pixels using a CMOS technology including a control circuit and a signal process circuit as peripheral circuits. The CIS may use a switching manner configured to sequentially detect outputs using the MOS transistors.

As a CIS pixel technology may have been developed, a probe card with a lens and a probe card without a lens may be required for testing a CIS wafer.

SUMMARY

Example embodiments may provide a probe card having improved test performance of a wafer.

Example embodiments may also provide a test apparatus having the above-mentioned probe card.

In some embodiments of the present disclosure, a test apparatus may include a probe card and a tester. The probe card may include a plurality of regions corresponding to dies of a wafer, respectively. The probe card may include a tray having a first region with a lens and a second region without a lens. The tester may be configured to generate a drive control signal for moving the tray in a first direction or a second direction to locate the first region or the second region at a position facing the dies.

In other embodiments of the present disclosure, a probe card may include a supporting plate, a tray, a tray guide, and an actuator. The tray may have a plurality of regions having sizes corresponding to dies of a wafer. The tray may have a first region with a lens and a second region without a lens. The tray guide may be configured to connect the tray with the supporting plate. The actuator may be configured to move the tray in a first direction or a second direction along with the tray guide.

According to example embodiments, in testing a CIS wafer, a wafer test process requiring a lens and a wafer test process non-requiring a lens may be performed using one probe card. Thus, the two wafer test processes may be unified into one test process.

Further, the wafer test might not include a process for exchanging the probe card to decrease a test time of the wafer.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Figure 1:
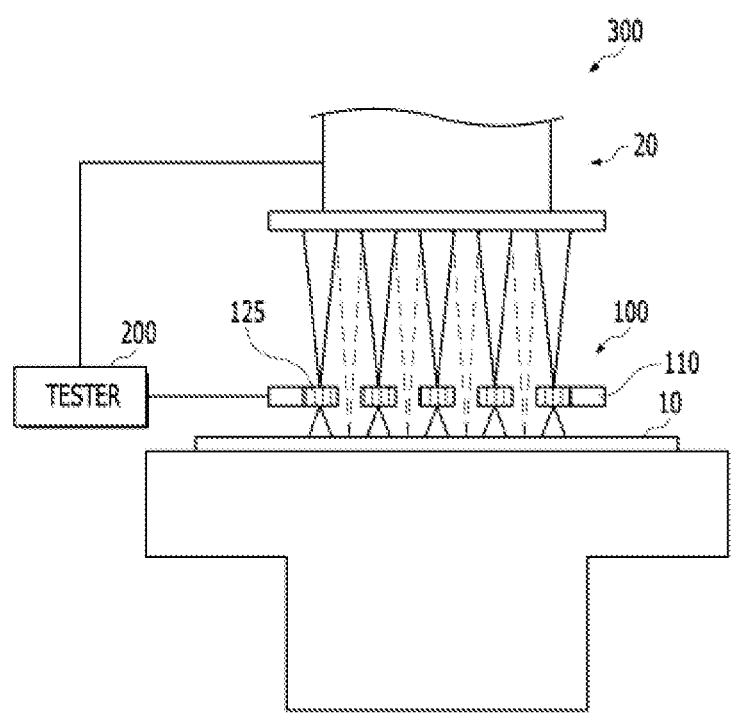
FIG. 1 is a view illustrating an appearance of a test apparatus in accordance with example embodiments.

FIG. 1 is a view illustrating an appearance of a test apparatus in accordance with example embodiments.

Referring to FIG. 1, a test apparatus 300 may include an illuminator 20, a probe card 100, and a tester 200.

The illuminator 20 may be configured to illuminate a wafer 10 with a light for testing the wafer 10.

The wafer 10 may include a CMOS image sensor (CIS) wafer, not restricted within a specific kind. Although not depicted in drawings, the CIS may include an active pixel sensor having a photo diode configured to receive the light, and a peripheral circuit. A plurality of two-dimensionally arranged pixel arrays may be configured to convert an optical image into an electrical signal. The peripheral circuit may include blocks such as a timing generator, a row/column scanner, a correlated double sampler, a gain amplifier, etc., and an ADC converter.

An image device such as the CIS may have performances determined in accordance with measurements of various items such as sensitivity, a noise, an operational range, etc. An input source of the measurements except for electrical characteristics may be mainly the light. The illuminator 20 may provide the wafer 10 with the light.

The probe card 100 may be arranged between the illuminator 20 and the wafer to test the wafer 10. The probe card 100 may include a region with a lens 125 and a region without a lens.

The tester 200 may be configured to control operations of the illuminator 20 and the probe card 100.

As shown in FIG. 1, the lights passing through the illuminator 20 may be irradiated to the wafer 10 through the region with the lens and the region without the lens.

Because a specific die (hereinafter, referred to as a target die) among the dies, which may be to be tested, of the wafer 10 may be designated, the tester 200 may perform a test with respect to the target die, although the light may be irradiated to all regions of the wafer 10. The tester 200 may control the light, which may be irradiated to a die not designated to be tested, to prevent an influence of the light on the target die. For example, the tester 200 may control the light, which may be irradiated to the die not corresponding to the target die and may have influence on the target die, by various manners such as compensations of the light.

The tester 200 may be configured to control various conditions of the light emitted from the illuminator 20.

Further, the tester 200 may be configured to control movements of the probe card 100 to selectively locate the region with the lens 125 or the region without the lens in the probe card 100 at a position facing the target die. The controls of the tester 200 with respect to the probe card 100 may be illustrated later.

Figure 2:
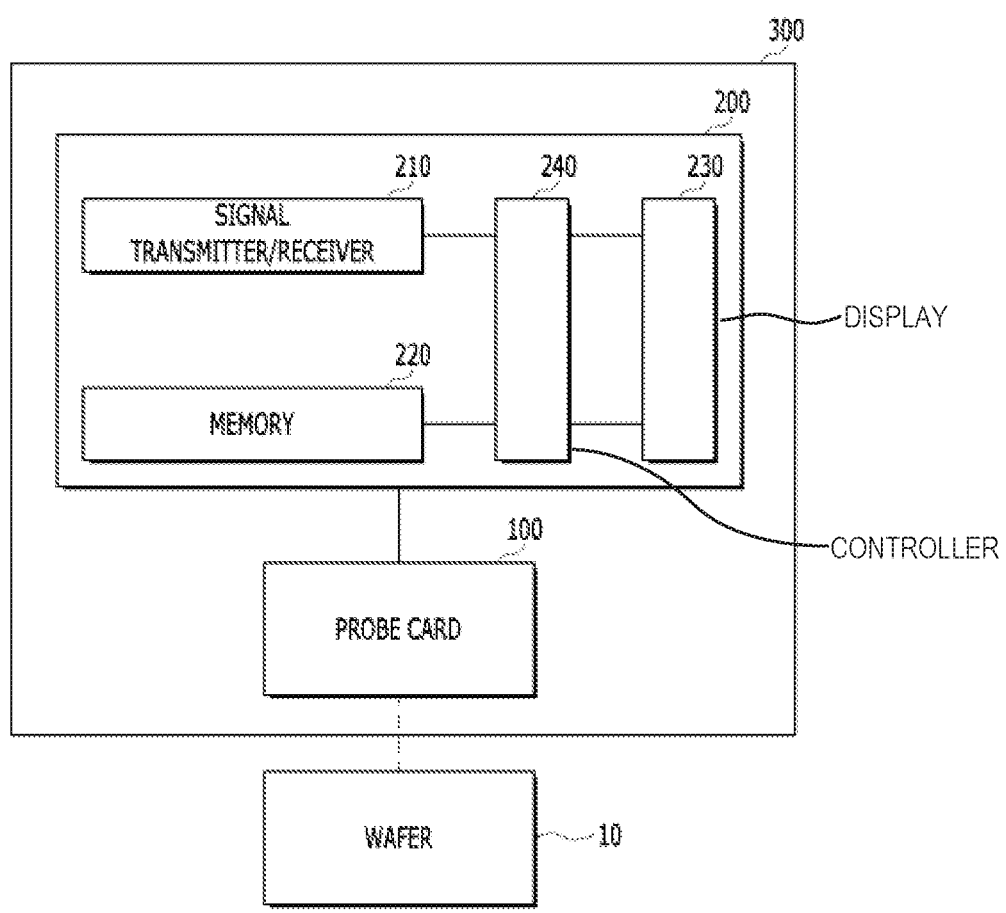
FIG. 2 is a view illustrating a configuration of a test apparatus in accordance with example embodiments.

FIG. 2 is a view illustrating a configuration of a test apparatus in accordance with example embodiments. Hereinafter, an example of the tray of the probe card may be illustrated with reference to FIG. 4.

Referring to FIG. 2, the test apparatus 300 may include the probe card 100 and the tester 200.

Although not depicted in drawings, the test apparatus 300 may further include the illuminator 20 in FIG. 1.

Figure 4:
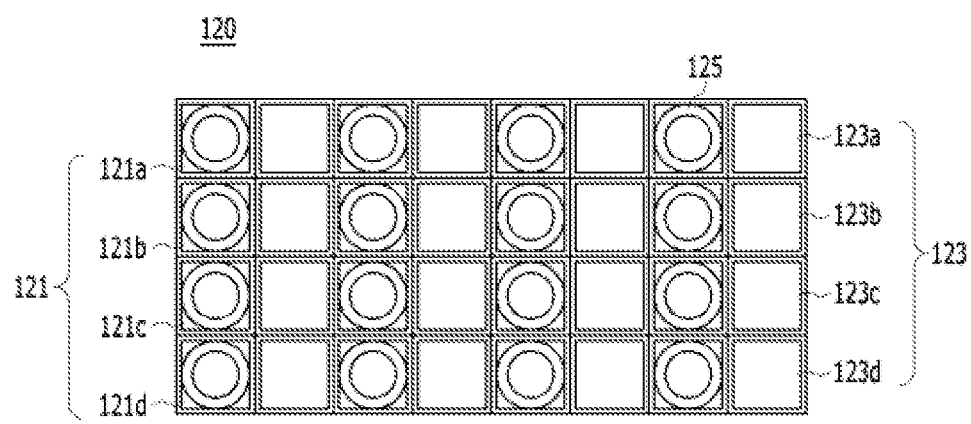
FIGS. 4, 5, and 6 are views illustrating trays of a probe card in accordance with example embodiments.

Referring to FIG. 4, the probe card 100 may include a tray 120 having a plurality of regions 121a, 121b, 121c, 121d, 123a, 123b 123c, and 123d corresponding to the dies of the wafer 10, respectively. The tray 120 may include a first region 121 with the lens 125 and a second region 123 without a lens.

The tester 200 may generate a drive control signal for moving the tray 120 in a first direction or a second direction to locate the first region 121 or the second region 123 of the tray 120 at a position facing the dies to be tested.

When the tray 120 may be moved in the first direction or the second direction, movement distances may be previously set as a distance corresponding to a die unit.

For example, when the first region 121 of the tray 120 facing a specific die may be moved by the drive control signal, the first region 121 may be moved to a position facing a left or right die adjacent to the specific die.

Referring to FIG. 2, the tester 200 may include a signal transmitter/receiver 210, a memory 220, a display 230, and a controller 240. The signal transmitter/receive 210 may be configured to transmit/receive various kinds of signals including control signals of the illuminator 20 and the probe card 100. The memory 220 may be configured to store information with respect to the movement distances of the tray 120, the first region 121 and the second region 123, the light of the illuminator 20, the tester 200 and test results. The display 230 may be configured to display the information of the tester 200. The controller 240 may be configured to control the operations of the illuminator 20 and the probe card 100.

Figure 3:
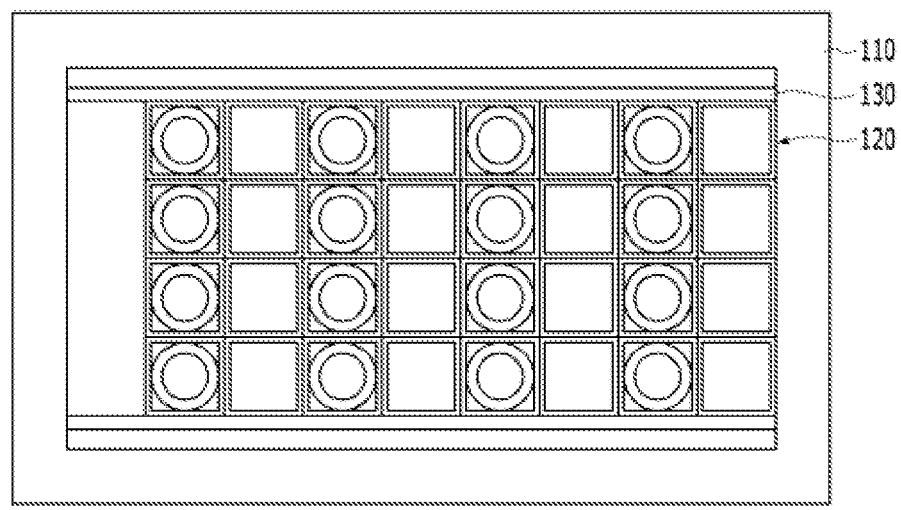
FIG. 3 is a view illustrating a probe card in accordance with example embodiments.

FIG. 3 is a view illustrating a probe card in accordance with example embodiments.

Hereinafter, trays of a probe card reference to FIGS. 4 to 8, operations of a probe card with reference to FIGS. 9 and 10, and a probe card with reference to FIGS. 11 and 12 may be illustrated in detail.

Referring to FIG. 3, the probe card 100 may include a supporting plate 110, a tray 120, and a tray guide 130.

Figure 5:
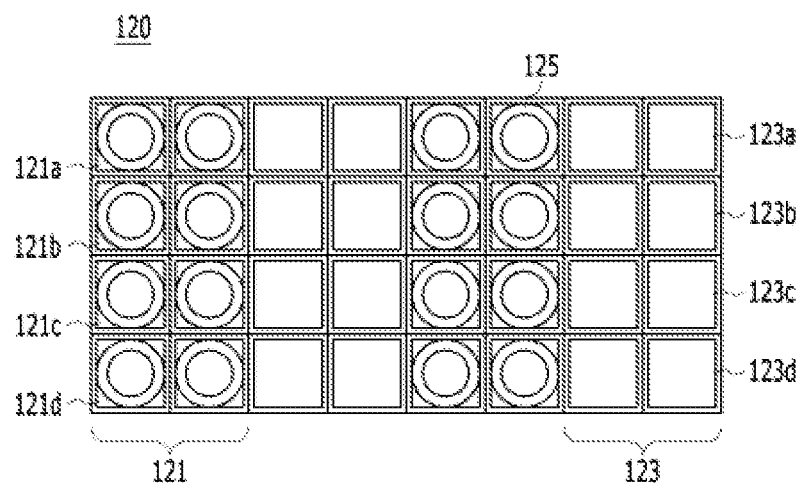
Figure 6:
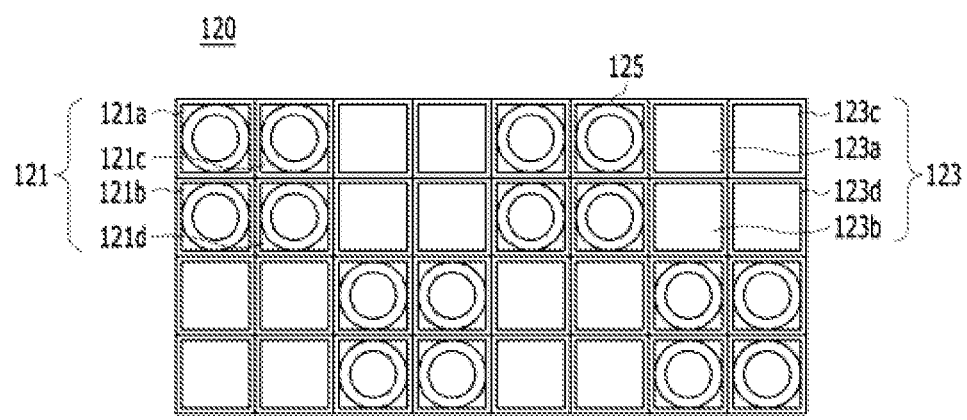

Referring to FIGS. 4 to 6, the tray 120 may be classified into the regions 121a, 121b, 121c, 121d, 123a, 123b 123c, and 123d corresponding to the dies of the wafer 10, respectively. The tray 120 may include the first region 121 with the lens 125 and the second region 123 without the lens.

Referring to FIG. 4, the first region 121 and the second region 123 of the tray 120 may be arranged corresponding to rows of the dies of the wafer 10. The first region 121 and the second region 132 may be alternately arranged.

Referring to FIG. 5, each of the alternately arranged first and second regions 121 and 123 may include a plurality of rows.

Referring to FIG. 6, each of the first region 121 and the second region 123 of the tray 120 may include a plurality of groups.

Particularly, each of the first region 121 and the second region 123 of the tray 120 may form the groups corresponding to the dies.

Figure 7:
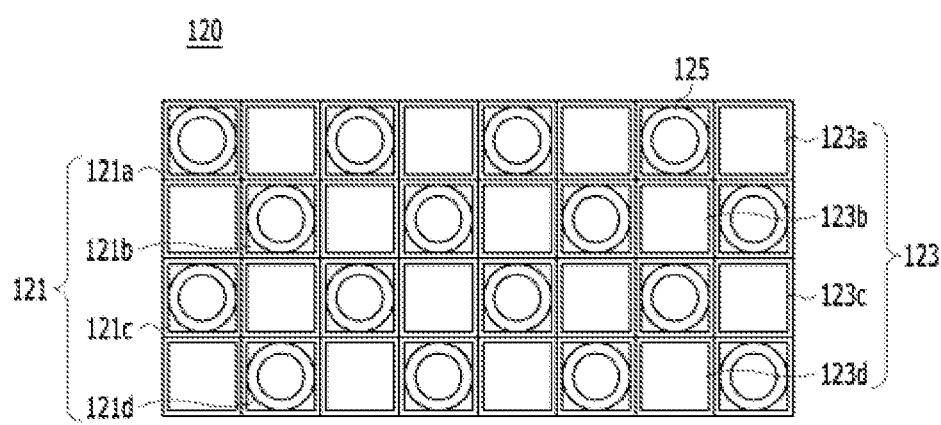
FIGS. 7 and 8 are views illustrating trays in accordance with example embodiments.

Referring to FIG. 7, the first region 121 and the second region 123 of the tray 120 may be arranged in an alternating pattern resembling a checker board.

Figure 8:
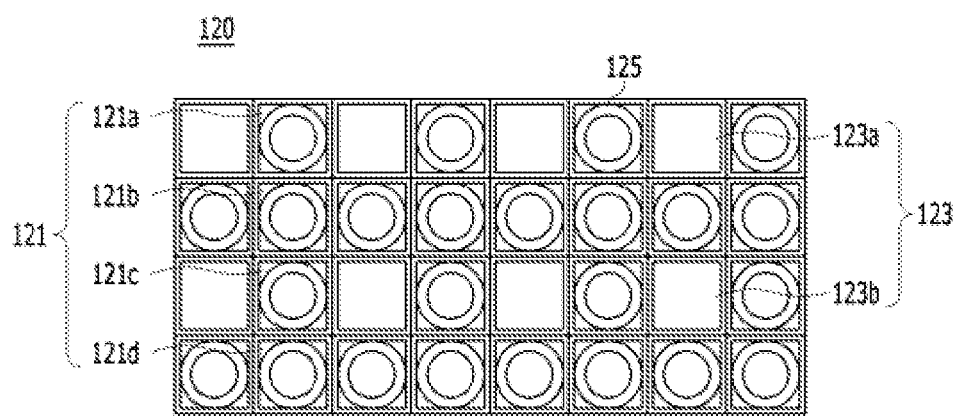

Alternatively, referring to FIG. 8, the first region 121 and the second region 123 of the tray 120 may be arranged in a cross pattern.

The shapes of the first and second regions 121 and 123 of the tray 120 are not restricted to the shapes illustrated in FIGS. 7 and 8. The shapes of the first and second regions 121 and 123 may be changed in accordance with practical need.

The tray guide 130 may be configured to connect the tray 120 with the supporting plate 110.

For example, the tray guide 130 may be connected to one end and the other end of the tray 120. This tray guide 130 may be connected with the supporting plate 110.

The tray 120 may be rotated and moved along the tray guide 130 to locate the first region 121 or the second region 123 of the tray 120 at the position facing the target die to be tested.

Figure 9:
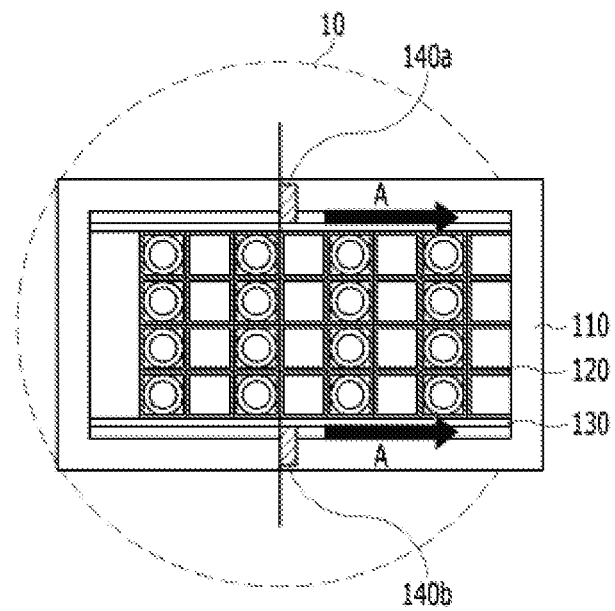
FIGS. 9 and 10 are views illustrating operations of a probe card in accordance with example embodiments.
Figure 10:
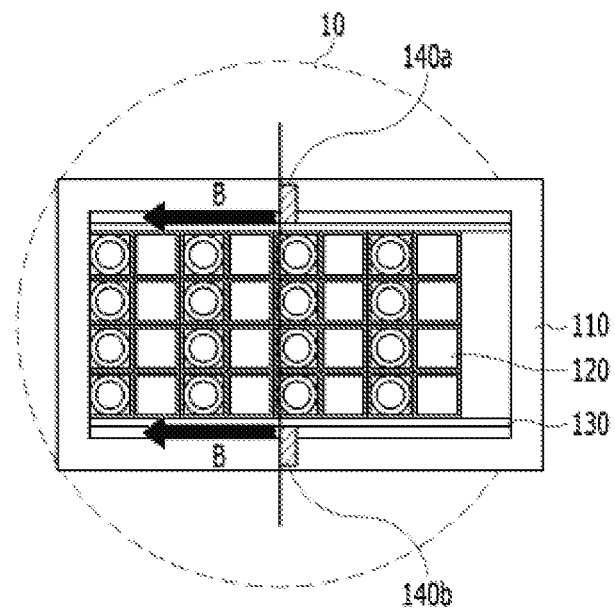
Figure 11:
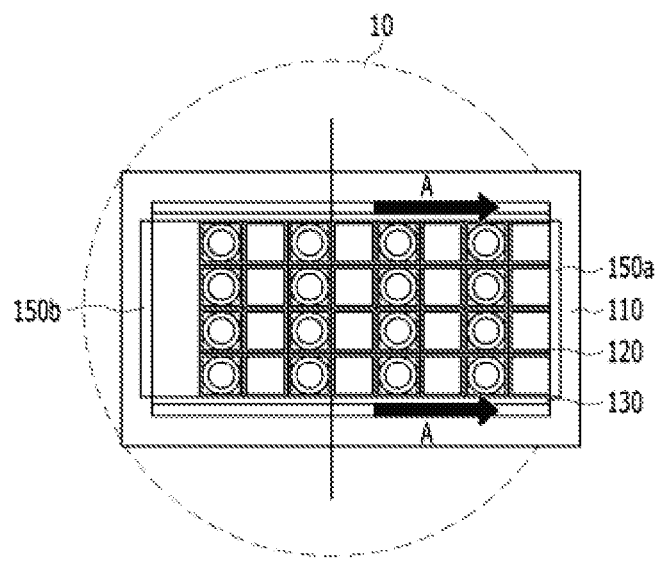
FIGS. 11 and 12 are views illustrating a probe card in accordance with example embodiments.
Figure 12:
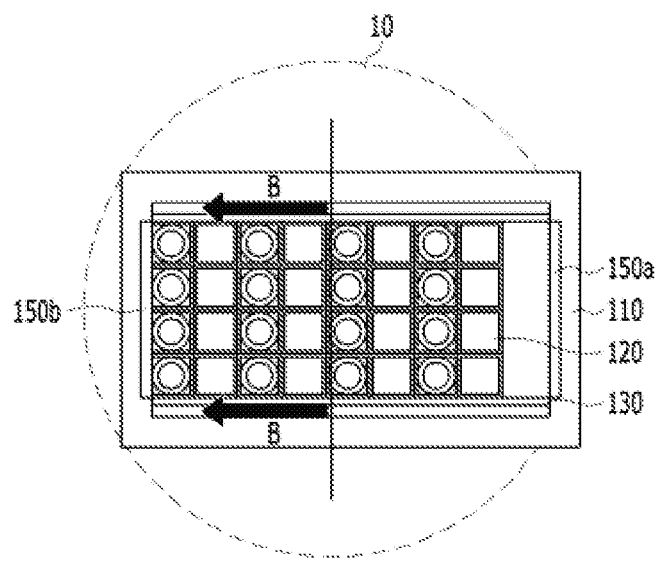

The actuators 140a, 140b, 150a, and 150b may be configured to move the tray 120 in the first direction indicated by "A" in FIGS. 9 and 11) or the second direction indicated by "B" in FIGS. 10 and 12 along the tray guide 130.

Particularly, the actuators 140a, 140b, 150a, and 150b may move the tray 120 in the first direction indicated by "A" in FIGS. 9 and 11 or the second direction indicated by "B" in FIGS. 10 and 12 along the tray guide 130 in accordance with the drive control signal transmitted from the tester 200.

The first direction in FIG. 9 may be a direction oriented toward one end of the supporting plate 110. The actuators 140a and 140b may move the tray 120 toward one end of the supporting plate 110. The second direction in FIG. 10 may be a direction oriented toward the other end of the supporting plate 110. The actuators 140a and 140b may move the tray 120 toward the other end of the supporting plate 110.

Referring to FIGS. 9 and 10, the actuators 140a and 140b may be connected with the tray 120. When a first signal from the tester 200 is inputted into the actuators 140a and 140b, the actuators 140a and 140b may move the tray 120 in the first direction A.

Further, when a second signal from the tester 200 is inputted into the actuators 140a and 140b, the actuators 140a and 140b may move the tray 120 in the second direction B.

The first signal may be generated by an on-signal of a switch. The second signal may be generated by an off-signal of the switch.

As shown in FIGS. 9 and 10, when the actuator may include the plurality of the actuators 140a and 140b, the actuator 140a may be configured to connect one end of the tray 120 with the supporting plate 110. The actuator 140b may be configured to connect the other end of the tray 120 with the supporting plate 110.

The actuators 140a and 140b may include a motor. Alternatively, the actuators 140a and 140b may include other configurations configured to move the tray 120, using power, in a specific direction.

Referring to FIGS. 11 and 12, the actuator may include a first electromagnet 150a and a second electromagnet 150b.

Referring to FIG. 11, the first electromagnet 150a may be arranged at one end of the supporting plate 110. When the first signal is inputted into the first electromagnet 150a from the tester 200, the first electromagnet 150a may draw the tray 120 in the first direction.

Referring to FIG. 12, the second electromagnet 150b may be arranged at the other end of the supporting plate 110. When the second signal is inputted into the second electromagnet 150b from the tester 200, the second electromagnet 150b may draw the tray 120 in the second direction.

When the actuator may include the electromagnet, the tray 120 may include a magnet.

The tester 200 may change electromagnetic forces of the first and second electromagnet 150a and 150b to control the drawing forces of the tray 120.

Figure 13:
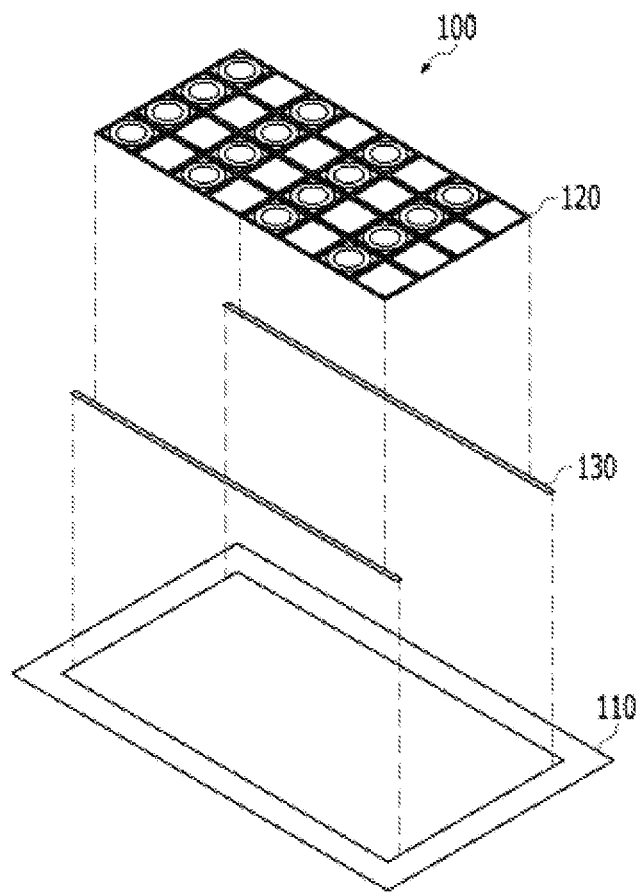
FIG. 13 is an exploded perspective view illustrating a probe card in accordance with example embodiments.

FIG. 13 is an exploded perspective view illustrating a probe card in accordance with example embodiments.

Any further illustrations with respect to elements of the probe card in accordance with example embodiments substantially the same as those in FIGS. 1 to 12 may be omitted herein for brevity.

Referring to FIG. 13, the probe card 100 may include the supporting plate 110, the tray 120, and the tray guide 130.

Referring to FIGS. 4 to 6, the tray 120 may be classified into the regions 121a, 121b, 121c, 121d, 123a, 123b, 123c, and 123d corresponding to the dies of the wafer 10, respectively. The tray 120 may include the first region 121 with the lens 125 and the second region 123 without the lens.

Referring to FIG. 4, the first region 121 and the second region 123 of the tray 120 may be arranged corresponding to rows of the dies of the wafer 10. The first region 121 and the second region 132 may be alternately arranged.

The tray guide 130 may be configured to connect the tray 120 with the supporting plate 110.

For example, the tray guide 130 may be connected to one end and the other end of the tray 120. The tray guide 130 may be connected with the supporting plate 110.

Although not depicted in drawings, the probe card 100 may further include an actuator configured to move the tray 120 along the tray guide 130 in the first direction or the second direction.

Particularly, the actuators 140a, 140b, 150a, and 150b may move the tray 120 in the first direction indicated by "A" in FIGS. 9 and 11) or the second direction indicated by "B" in FIGS. 10 and 12 along the tray guide 130 in accordance with the drive control signal transmitted from the tester 200.

The first direction in FIG. 9 may be a direction oriented toward one end of the supporting plate 110. The actuators 140a and 140b may move the tray 120 toward one end of the supporting plate 110. The second direction in FIG. 10 may be a direction oriented toward the other end of the supporting plate 110. The actuators 140a and 140b may move the tray 120 toward the other end of the supporting plate 110.

Referring to FIGS. 9 and 10, the actuators 140a and 140b may be connected with the tray 120. When a first signal from the tester 200 is inputted into the actuators 140a and 140b, the actuators 140a and 140b may move the tray 120 in the first direction A.

Further, when a second signal from the tester 200 is inputted into the actuators 140a and 140b, the actuators 140a and 140b may move the tray 120 in the second direction B.

The first signal may be generated by an on-signal of a switch. The second signal may be generated by an off-signal of the switch.

As shown in FIGS. 9 and 10, when the actuator may include the plurality of the actuators 140a and 140b, the actuator 140a may be configured to connect one end of the tray 120 with the supporting plate 110. The actuator 140b may be configured to connect the other end of the tray 120 with the supporting plate 110.

The actuators 140a and 140b may include a motor. Alternatively, the actuators 140a and 140b may include other configurations configured to move the tray 120, using power, in a specific direction.

Referring to FIGS. 11 and 12, the actuator may include a first electromagnet 150a and a second electromagnet 150b.

Referring to FIG. 11, the first electromagnet 150a may be arranged at one end of the supporting plate 110. When the first signal is inputted into the first electromagnet 150a from the tester 200, the first electromagnet 150a may draw the tray 120 in the first direction.

Referring to FIG. 12, the second electromagnet 150b may be arranged at the other end of the supporting plate 110. When the second signal is inputted into the second electromagnet 150b from the tester 200, the second electromagnet 150b may draw the tray 120 in the second direction.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A test apparatus comprising:
   a probe card including a tray having a plurality of regions corresponding to dies of a wafer, the tray including a first region with a lens and a second region without a lens; and
   a tester configured to generate a drive control signal for moving the tray in a first direction or a second direction to locate the first region or the second region at a position facing a target die, which is to be tested, among the dies.

2. The test apparatus of claim 1, wherein the probe card comprises:
   a supporting plate;

the tray having the plurality of regions corresponding to the dies of the wafer, respectively, the tray including the first region with the lens and the second region without the lens;

a tray guide connected between the tray and the supporting plate; and an actuator configured to move the tray along the tray guide in the first direction or the second direction in accordance with the drive control signal.

3. The test apparatus of claim 2, wherein the actuator is connected to the tray to move the tray in the first direction when a first signal is inputted to the actuator from the tester and to move the tray in the second direction when a second signal is inputted to the actuator from the tester.

4. The test apparatus of claim 3, wherein the actuator comprises a plurality of actuators, wherein a first portion of the plurality of actuators are connected between one end of the tray and the supporting plate, and wherein a second portion of the plurality of actuators are connected between the other end of the tray and the supporting plate.

5. The test apparatus of claim 3, wherein the actuator comprises a motor.

6. The test apparatus of claim 2, wherein the actuator comprises:

a first electromagnet arranged at one end of the supporting plate to draw the tray in the first direction when a first signal is inputted to the first electromagnet from the tester; and a second electromagnet arranged at the other end of the supporting plate to draw the tray in the second direction when a second signal is inputted to the second electromagnet from the tester.

7. The test apparatus of claim 6, wherein the tray comprises a magnet.

8. The test apparatus of claim 1, wherein the first region and the second region of the tray are arranged corresponding to rows of the dies, and the first region and the second region are alternately arranged.

9. The test apparatus of claim 1, wherein the first region and the second region of the tray form groups corresponding to the dies.

10. The test apparatus of claim 1, wherein the first region and the second region of the tray are arranged in a checkerboard pattern or a cross pattern.

11. A probe card comprising:

a supporting plate;

a tray having a plurality of regions corresponding to dies of a wafer, respectively, the tray including a first region with a lens and a second region without a lens;

a tray guide connected between the tray and the supporting plate; and an actuator configured to move the tray along the tray guide in a first direction or a second direction.

12. The probe card of claim 11, wherein the actuator is connected to the tray to move the tray in the first direction when a first signal is inputted to the actuator from the tester and to move the tray in the second direction when a second signal is inputted to the actuator from the tester.

13. The probe card of claim 12, wherein the actuator comprises a plurality of actuators, wherein a first portion of the plurality of actuators are connected between one end of the tray and the supporting plate, and wherein a second portion of the plurality of actuators are connected between the other end of the tray and the supporting plate.

14. The probe card of claim 12, wherein the actuator comprises a motor.

15. The probe card of claim 11, wherein the actuator comprises:

a first electromagnet arranged at one end of the supporting plate to draw the tray in the first direction when a first signal is inputted to the first electromagnet from the tester; and a second electromagnet arranged at the other end of the supporting plate to draw the tray in the second direction when a second signal is inputted to the second electromagnet from the tester.

16. The probe card of claim 15, wherein the tray comprises a magnet.

17. The probe card of claim 11, wherein the tray guide is connected to one end and the other end of the tray, and the tray guide is connected to the supporting plate.

18. The probe card of claim 11, wherein the first region and the second region of the tray are arranged corresponding to rows of the dies, and the first region and the second region are alternately arranged.

19. The probe card of claim 11, wherein the first region and the second region of the tray form groups corresponding to the dies.

20. The probe card of claim 11, wherein the first region and the second region of the tray are arranged in a checkerboard pattern or a cross pattern.

* * * * *